(12) United States Patent
Yagita et al.

(10) Patent No.: US 7,411,709 B2
(45) Date of Patent: Aug. 12, 2008

(54) BEAM PROCESSING SYSTEM AND BEAM PROCESSING METHOD

(75) Inventors: Takanori Yagita, Ehime (JP); Hisaki Izutani, Ehime (JP); Mitsukuni Tsukihara, Ehime (JP); Takashi Kuroda, Ehime (JP)

(73) Assignee: Sen Corporation, Tokyo (JP)

( * ) Notice: Subject to any disclaimer, the term of this patent is extended or adjusted under 35 U.S.C. 154(b) by 0 days.

(21) Appl. No.: 11/806,546

(22) Filed: Jun. 1, 2007

(65) Prior Publication Data
US 2008/0002244 A1    Jan. 3, 2008

(30) Foreign Application Priority Data
Jun. 2, 2006    (JP) .............................. 2006-155306

(51) Int. Cl.
*G02B 26/08*    (2006.01)
*G21K 5/10*    (2006.01)

(52) U.S. Cl. ..................... 359/196; 359/900; 250/492.1

(58) Field of Classification Search ................. 359/196; 250/492.1, 492.21
See application file for complete search history.

(56) References Cited

U.S. PATENT DOCUMENTS 4,899,059 A    2/1990    Freytsis et al.

2006/0097196 A1    5/2006    Graf

FOREIGN PATENT DOCUMENTS

| GB | 2 389 958 A | 6/2002 |
|---|---|---|
| JP | 4308084 | 10/1992 |
| JP | 2909932 B2 | 4/1999 |
| JP | 2006-60159 A | 3/2006 |

*Primary Examiner*—James Phan
(74) *Attorney, Agent, or Firm*—Arent Fox LLP

(57) ABSTRACT

A beam processing system comprises a rotary disk mounted thereon with processing objects, a controller for controlling a reciprocating drive mechanism, and a beam width measuring unit for measuring a beam width of a processing beam. The controller sets an inner and an outer overscan position depending on a measured value of the beam width. The controller, based on the number of rotation of the rotary disk per unit time, a scan speed and the number of reciprocating scan times, a reversal start timing of the rotary disk at at least one of the inner and the outer overscan positions, and the measured value, controls the reciprocating drive mechanism so as to ensure an overlap region between a last and a current processing beam irradiation region on each of the processing objects, the overlap region overlapping at least half of the last processing beam irradiation region.

26 Claims, 6 Drawing Sheets

BEAM PROCESSING SYSTEM AND BEAM PROCESSING METHOD

This application is based upon and claims the benefit of priority from Japanese patent application No. 2006-155306, filed on Jun. 2, 2006, the disclosure of which is incorporated herein its entirety by reference.

BACKGROUND OF THE INVENTION

This invention relates to improvements in a beam processing system and a beam processing method for uniformly irradiating a beam of light, electrons, ions, or the like (particle beam) onto processing objects.

As a method of irradiating a beam of electrons, ions, or the like onto processing objects to thereby process them, there is known a method in which a plurality of processing objects are mounted on the same circumference of a rotary disk and, by rotating the rotary disk, a beam crosses the processing objects to scan them. In this method, the rotary disk is generally also reciprocated in its radial direction to thereby allow the beam to be irradiated over the entire surface of each processing object, which is called a mechanical scan. As a typical application example of such a mechanical scan, there is an ion implantation system for implanting ions into silicon wafers in the manufacturing process of semiconductor devices.

Referring to FIG. 1, a description will be given of particularly the rotary disk side in a mechanical scan type ion implantation system. A plurality of wafers (processing objects) 110 are mounted on the same circumference near the rim of a rotary disk 100. A scan direction by rotation of the rotary disk 100 and a scan direction by reciprocating movement (vertical direction in FIG. 1) of the rotary disk 100 are set perpendicular to each other. A beam 120 is fixedly irradiated at a specific position of a moving path of the wafers 110. By the combination of such two-direction scans, ion implantation is performed over the entire surface of each wafer 110. Normally, the rotational speed of the rotary disk 100 is sufficiently higher than the reciprocating speed of the rotary disk 100. Therefore, the scan by the rotation of the rotary disk 100 is called a high-speed scan, while the scan by the reciprocating movement of the rotary disk 100 is called a low-speed scan or a Y scan.

Since the rotary disk 100 is normally rotated at a constant speed (constant angular velocity), the scan speed of a high-speed scan increases in proportion to a radial distance R, where the beam hits on the rotary disk 100, as seen from the center of the rotary disk 100. Therefore, if a Y scan is simply performed with a uniform motion, the ion implantation density (concentration) becomes low at a portion where the scan speed of the high-speed scan is high, while the ion implantation density becomes high at a portion where the scan speed is low. For compensation thereof, the Y scan is slowed down at a portion where the high-speed scan becomes fast (i.e. the distance R is large), while, the Y scan is speeded up at a portion where the high-speed scan becomes slow (i.e. the distance R is small), thus achieving a uniform implantation amount (dose) by combining them. That is, the Y scan is performed by changing its speed so as to be inversely proportional to the radial distance R where the beam hits on the rotary disk 100.

The method of changing the speed of the Y scan in inverse proportion to the radial distance R of the rotary disk 100 as described above is called a (1/R) scan and employed in most batch-type ion implantation systems using a rotary disk [e.g. Patent Document 1: Japanese Unexamined Patent Application Publication (JP-A) No. 2006-60159].

The Y scan is repeated with a constant stroke. This stroke is defined between an outer overscan position and an inner overscan position. The outer overscan position is a position where beam irradiation is offset from the wafer 110 on the outer side of the rotary disk 100 due to movement of the rotary disk 100 downward in FIG. 1. The inner overscan position is a position where beam irradiation is offset from the wafer 110 on the inner side of the rotary disk 100 due to movement of the rotary disk 100 upward in FIG. 1. Referring to FIG. 1, assuming that the beam is initially located at the outer overscan position, the rotary disk 100, while being rotated, is driven upward until the beam reaches the inner overscan position. When the beam has reached the inner overscan position, the direction of the Y scan of the rotary disk 100 is reversed so that the rotary disk 100 is driven downward. When the beam has reached the outer overscan position, the direction of the Y scan of the rotary disk 100 is reversed so that the rotary disk 100 is driven upward. One reciprocating operation in which a beam starts from the outer overscan position and returns to the outer overscan position via the inner overscan position is given as one Y scan (one reciprocating scan).

On the other hand, for positioning control of the rotary disk 100, an initial position detection target portion 101 is provided at a predetermined position on the rotary disk 100 and a target portion sensor (not shown) for detecting the initial position detection target portion 101 is provided in the vicinity of the rim of the rotary disk 100. A detection signal from the target portion sensor is sent to a controller (not shown) having a function to control a motor which drives the rotary disk 100, and the controller uses this detection signal to implement positioning control of the rotary disk 100 [e.g. Patent Document 2: Japanese Patent (JP-B) No. 2909932].

The diameter of a wafer is mainly 200 mm or 300 mm. On the other hand, a beam normally has a circular cross section, but may have a flat cross section elongated in the horizontal direction. Hereinbelow, the diameter size in the case of the beam with the circular cross section and the vertical size in the case of the beam with the flat cross section will be collectively referred to as a "beam size". In either event, since the beam size of the beam irradiated onto the wafers 110 is smaller than the diameter of each wafer, beam overlap irradiation like so-called overlap painting is carried out for achieving better uniformity of ion implantation. This is, in terms of one wafer, a method of causing regions of continuous twice beam irradiation on the wafer to partially overlap each other and is realized by performing a Y scan so that scan regions by a high-speed scan partially overlap each other. That is, if the beam is irradiated onto a partial region of the wafer at a certain rotation timing of the rotary disk 100, the beam is, at the next rotation of the rotary disk 100, irradiated onto the wafer so as to provide a region overlapping part of the above partial region on the wafer. Hereinafter, this overlap region will also be called a "beam overlap amount".

The reason for employing such an overlap irradiation method is as follows. The (1/R) scan is ignored in the following explanation.

In the batch-type ion implantation system, when the rotary disk 100 is rotated at a low rotational speed reduced to half or less a normal high rotational speed, assuming that the Y-scan speed is equal to that at the time of the high-speed rotation, the distance of the Y-scan (scan pitch) moving during one rotation of the rotary disk 100 increases.

As the scan pitch during one rotation of the rotary disk 100 increases, the beam overlap amount in beam irradiation decreases. With respect to the beam size, as the beam size decreases, the beam overlap amount decreases. Then, if the scan pitch increases to be greater than a certain value or if the beam size decreases to be smaller than a certain value, the beam overlap amount decreases to be smaller than zero so that there is no overlap at all.

As shown in FIG. 1 as "High-Speed Rotation", a scan pitch $P_H$ during one rotation of the rotary disk 100 is considerably small in the case of normal high-speed disk rotation (e.g. 800 to 1200 rpm) and, therefore, even if the beam size decreases, the beam overlap amount does not become zero unless the beam size becomes equal to or less than the scan pitch $P_H$. Accordingly, even if the rotation start position of disk rotation is random every time a Y scan is started, no problem arises.

However, as shown in FIG. 1 as "Low-Speed Rotation", in the case of low-speed disk rotation (e.g. 150 to 300 rpm), assuming that the Y-scan speed is equal to that in the case of "High-Speed Rotation", a scan pitch $P_L$ during one rotation of the rotary disk 100 becomes large. In this case, under the conditions that the beam size is small and so on, possibility is expected that there is no beam overlap to cause occurrence of ion implantation unevenness or nonuniformity. Since the Y scan and the disk rotation are controlled independently of each other, it is considered that, in the case of the beam size that can achieve a certain beam overlap amount, if the Y scan is performed a plurality of times, ions are randomly implanted, so that the ion implantation unevenness finally disappears even in the case of the low-speed disk rotation.

However, as shown in FIG. 2, there occurs a case where the rotation start position of the rotary disk 100 at the start of a Y scan synchronizes (not "coincides") or pseudo-synchronizes with the last rotation start position of the rotary disk 100. In this case, ion implantation is concentrated at certain portions of the wafers, so that there occurs a case where even if the Y scan is performed N times, the ion implantation uniformity is degraded to exceed 1%. This occurs particularly when a beam size Bs is not sufficiently large with respect to a scan pitch P (=Y-scan speed×disk rotation period), (P≧Bs), i.e. there is no beam overlap. FIG. 2 shows a transition of beam irradiation with respect to one wafer when a Y scan (reciprocating scan) is performed N times while the rotary disk 100 makes i rotations. If an irradiation state (state of the rotating wafer 110 observed at the same passing point) shown as "Final Implantation State" at the final stage in FIG. 2 is expressed in a plan view up to five Y-scan times, FIG. 6A is obtained, wherein regions with no beam overlap are formed. Naturally, FIG. 2 exaggeratingly shows the transition of beam irradiation for facilitating better understanding.

Of course, the foregoing problem is solved by reducing the Y-scan speed so as to produce beam overlap. However, in this case, there arises a new problem such as a problem of reduction in processing speed due to a reduction in Y-scan speed or a problem of rise in temperature of wafers due to prolongation of a beam irradiation time. Accordingly, there are also circumstances that cannot allow the Y-scan speed to be unlimitedly lowered.

SUMMARY OF THE INVENTION

It is therefore an exemplary object of this invention to provide a beam processing system and a beam processing method that do not reduce uniformity of beam irradiation onto processing objects even if the rotational speed of a rotary disk is low.

It is another exemplary object of this invention to accomplish the above object without reducing the processing speed so much.

A beam processing system according an exemplary aspect of this invention comprises a disk mounted thereon with a plurality of processing objects on the same circumference, a rotation drive mechanism for rotating the disk about a disk axis, a reciprocating drive mechanism for causing the disk, while rotating, to perform a reciprocating scan motion in a direction perpendicular to the disk axis within a stroke range defined by an inner overscan position and an outer overscan position, and a controller for controlling at least the reciprocating drive mechanism. The beam processing system causes the plurality of processing objects to pass through an irradiation position of a processing beam by rotation and the reciprocating scan motion of the disk, to thereby irradiating the processing beam onto the plurality of processing objects. The beam processing system further comprises a beam width measuring unit for measuring a beam width of the processing beam. The controller sets the inner overscan position and the outer overscan position depending on a measured value of the beam width or a predetermined value of the beam width. The controller, based on the number of rotation of the disk per unit time, a scan speed and the number of reciprocating scan times of the reciprocating scan motion, a reversal start timing of the disk at at least one of the inner overscan position and the outer overscan position, and the measured value of the beam width or the predetermined value of the beam width, controls the reciprocating drive mechanism so as to ensure an overlap region between a last and a current processing beam irradiation region on each of the plurality of processing objects, the overlap region overlapping at least half of the last processing beam irradiation region.

A beam processing method according to another exemplary aspect of this invention causes a disk mounted thereon with a plurality of processing objects on the same circumference to rotate about a disk axis, causes the disk, while rotating, to perform a reciprocating scan motion in a direction perpendicular to the disk axis within a stroke range defined by an inner overscan position and an outer overscan position, and causes the plurality of processing objects to pass through an irradiation position of a processing beam by rotation and the reciprocating scan motion of the disk, thereby irradiating the processing beam onto the plurality of processing objects. The beam processing method comprises measuring a beam width of the processing beam and setting the inner overscan position and the outer overscan position depending on a measured value of the beam width or a predetermined value of the beam width. The beam processing method further comprises, based on the number of rotation of the disk per unit time, a scan speed and the number of reciprocating scan times of the reciprocating scan motion, a reversal start timing of the disk at at least one of the inner overscan position and the outer overscan position, and the measured value of the beam width or the predetermined value of the beam width, controlling the reciprocating scan motion so as to ensure an overlap region between a last and a current processing beam irradiation region on each of the plurality of processing objects, the overlap region overlapping at least half of the last processing beam irradiation region.

In an exemplary aspect of this invention, in order to solve the foregoing problem, it is configured such that, by controlling the reversal start timing of each reciprocating scan, the beam overlap amount is ensured in every beam irradiation onto each processing object and is uniformly distributed on each processing object. Accordingly, the disk rotation and the reciprocating scan are prevented from having the relationship therebetween that causes a problem in uniformity of beam irradiation (prevented from causing synchronization or pseudo-synchronization), thereby enabling uniform beam irradiation onto each processing object.

According to this invention, even when the rotational speed of the disk is low, it is possible to uniformly irradiate the beam onto the processing objects without largely reducing the processing speed.

DESCRIPTION OF THE EXEMPLARY EMBODIMENT

Hereinbelow, a beam processing system and a beam processing method according to this invention will be described.

The gist of an exemplary embodiment of this invention resides in that, based on the number of rotation of a rotary disk per unit time, a Y-scan (reciprocating-scan) speed, the number of Y-scan times, a reversal start timing of the rotary disk at at least one of an inner overscan position and an outer overscan position referred to before, and a measured value of a beam width or a predetermined value of a beam width, beam irradiation is carried out continuously or discontinuously onto wafers so as to always provide an overlap region overlapping at least half of a previous beam irradiation region on each wafer, and particularly resides in a Y-scan control manner therefor. Accordingly, this invention is applicable to any existing beam processing system as long as it is a batch-type beam processing system employing the mechanical scan type.

Hereinbelow, a description will be given of an exemplary embodiment in which this invention is applied to a batch-type ion implantation system employing the mechanical scan type. As is well known, the ion implantation system comprises an ion source, a mass analysis magnet device, a wafer chamber, and so on. Detailed illustration and description are omitted with respect to the structures other than the wafer chamber. The measured value of the beam width represents a beam size measured by a beam profile measuring unit having a function of a beam width measuring unit. On the other hand, the predetermined value of the beam width represents a value set based on average data of measured values of the beam width size measured by the beam profile measuring unit when performing test evaluation of the ion implantation system based on setting of respective ion species (arsenic (As), phosphorus (P), boron (B), etc.), beam energy, and a beam current value.

Figure 1:
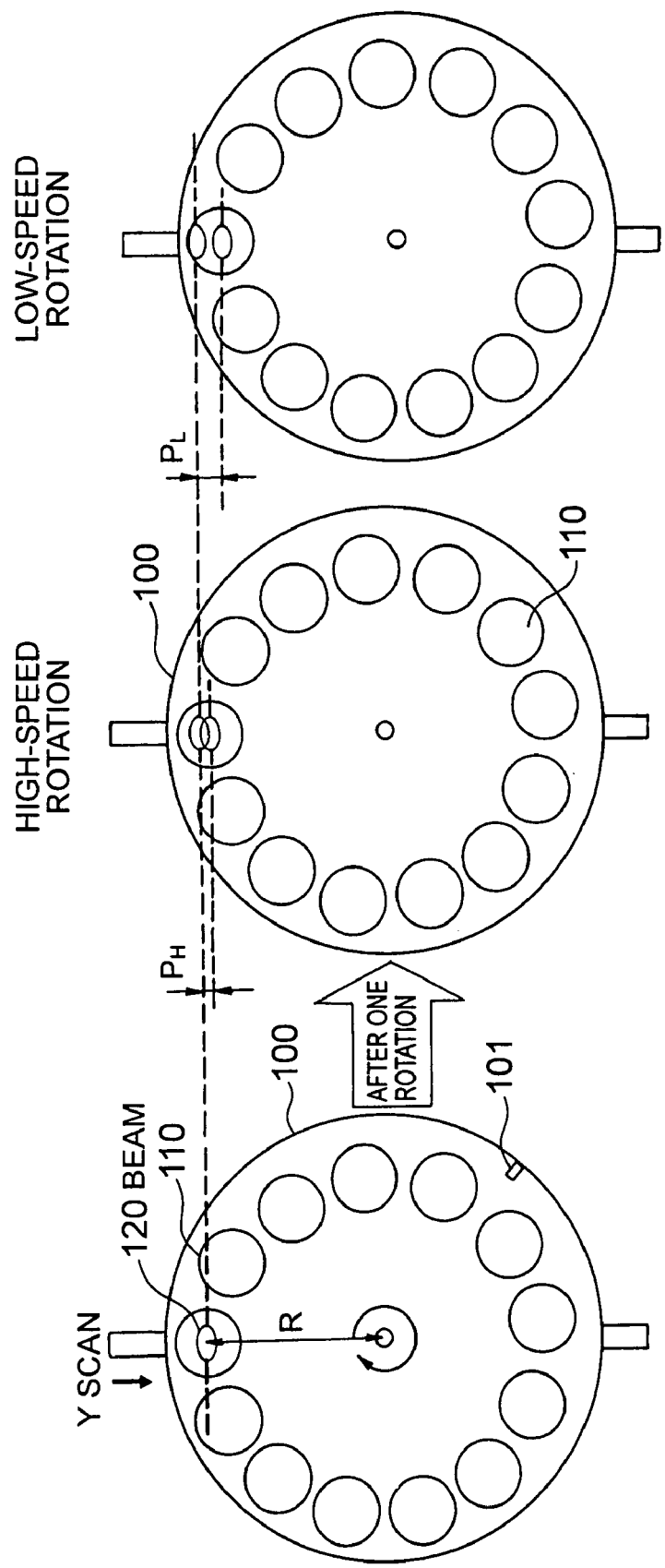
FIG. 1 is a diagram for explaining the operation of a rotary disk in an ion implantation system in a related art.
Figure 3:
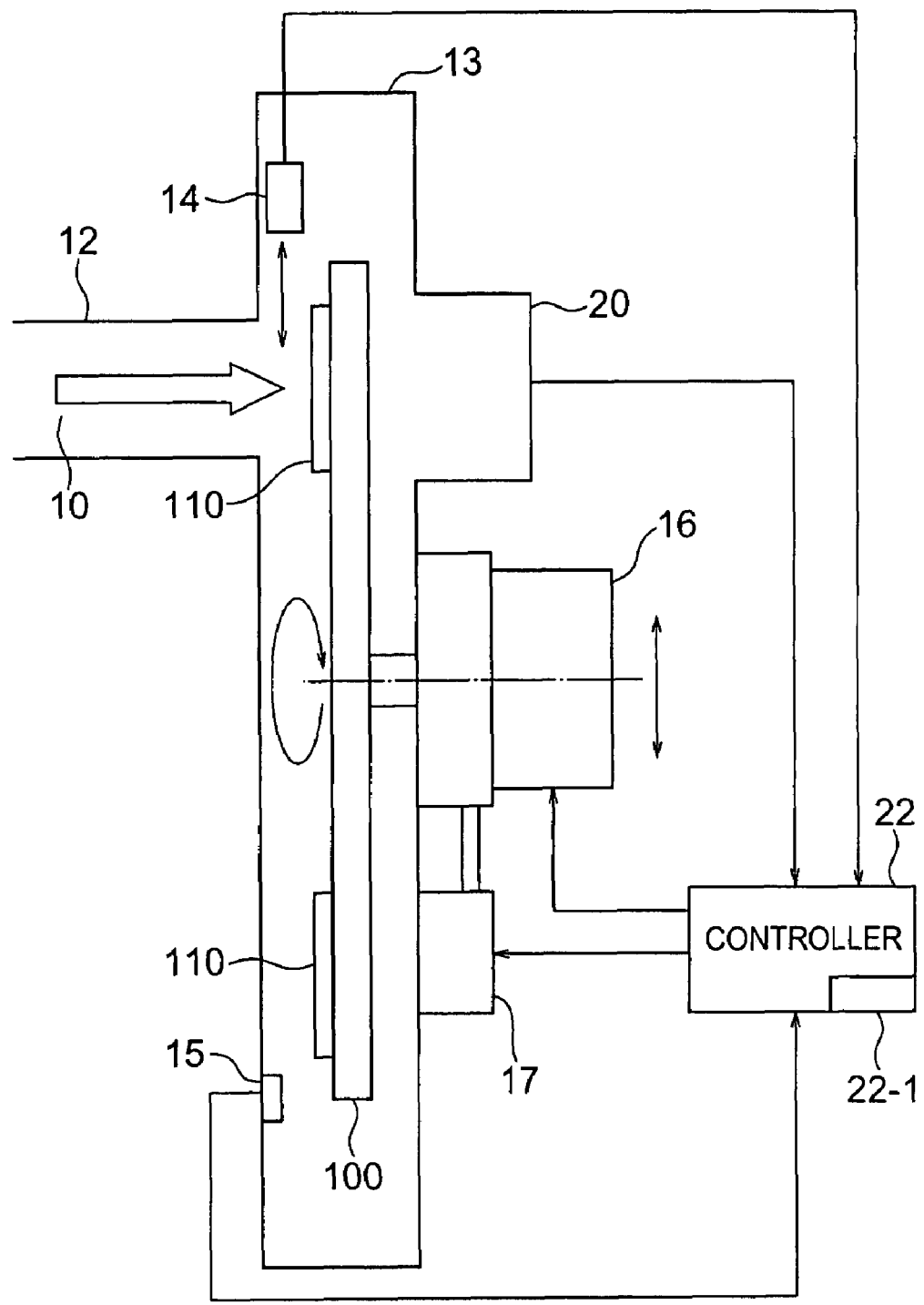
FIG. 3 is a diagram showing a schematic structure of a rotary disk and its drive system in an ion implantation system according to this invention.

FIG. 3 shows a schematic structure on the inside and outside of the wafer chamber in the ion implantation system, i.e. a schematic structure of a rotary disk and its drive system. As the rotary disk, use is made of the rotary disk 100 explained with reference to FIG. 1.

In FIG. 3, the ion implantation system comprises a guide chamber 12 for guiding an ion beam 10 from an ion source (not shown) and a wafer chamber 13 for implanting the ion beam 10 from the guide chamber 12 into wafers 110.

The rotary disk 100 is installed in the wafer chamber 13. The rotary disk 100 is rotated at high speed about a rotation shaft provided at its center by a high-speed scan drive mechanism (rotation drive mechanism) 16. By this rotation, the wafers 110 mounted at intervals on the same circumference of the rotary disk 100 are scanned at high speed and, simultaneously, the wafers 110 are also scanned at low speed in the vertical direction in FIG. 3. A low-speed scan drive mechanism (reciprocating drive mechanism) 17 is provided for the latter scan, i.e. for allowing each of the wafers 110 to be also scanned at low speed in the radial direction with respect to the rotation shaft. Herein, as the low-speed scan drive mechanism 17, use is made of a drive mechanism that can control a low-speed scan (reciprocating scan) operation.

As described before, a scan direction by the rotation of the rotary disk 100 and a Y-scan direction by the reciprocating movement (vertical direction in FIG. 3) of the rotary disk 100 are set perpendicular to each other and the ion beam 10 is fixedly irradiated at a specific position of a moving path of the wafers 110. By the combination of such two-direction scans, ions are uniformly implanted the whole of each wafer 110.

A beam current measuring device 20 is installed rearward of the rotary disk 100 arranged in the wafer chamber 13, i.e. on the side opposite to the ion beam irradiation surface of the rotary disk 100. In the wafer chamber 13, there are further provided a beam profile measuring unit 14 which serves as a beam width measuring unit and referred to above and a target portion sensor (target detecting unit) 15 for detecting the initial position detection target portion 101 explained with reference to FIG. 1. The beam profile measuring unit 14 is allowed to appear on and disappear from a trajectory of the ion beam 10 by a drive mechanism (not shown).

A controller 22 performs a predetermined calculation based on the detection results from the beam profile measuring unit 14, the target portion sensor 15, and the beam current measuring device 20 so as to control a Y scan of the low-speed scan drive mechanism 17, thereby uniformly implanting ions into each wafer 110. Further, the controller 22 controls the high-speed scan drive mechanism 16.

Figure 4:
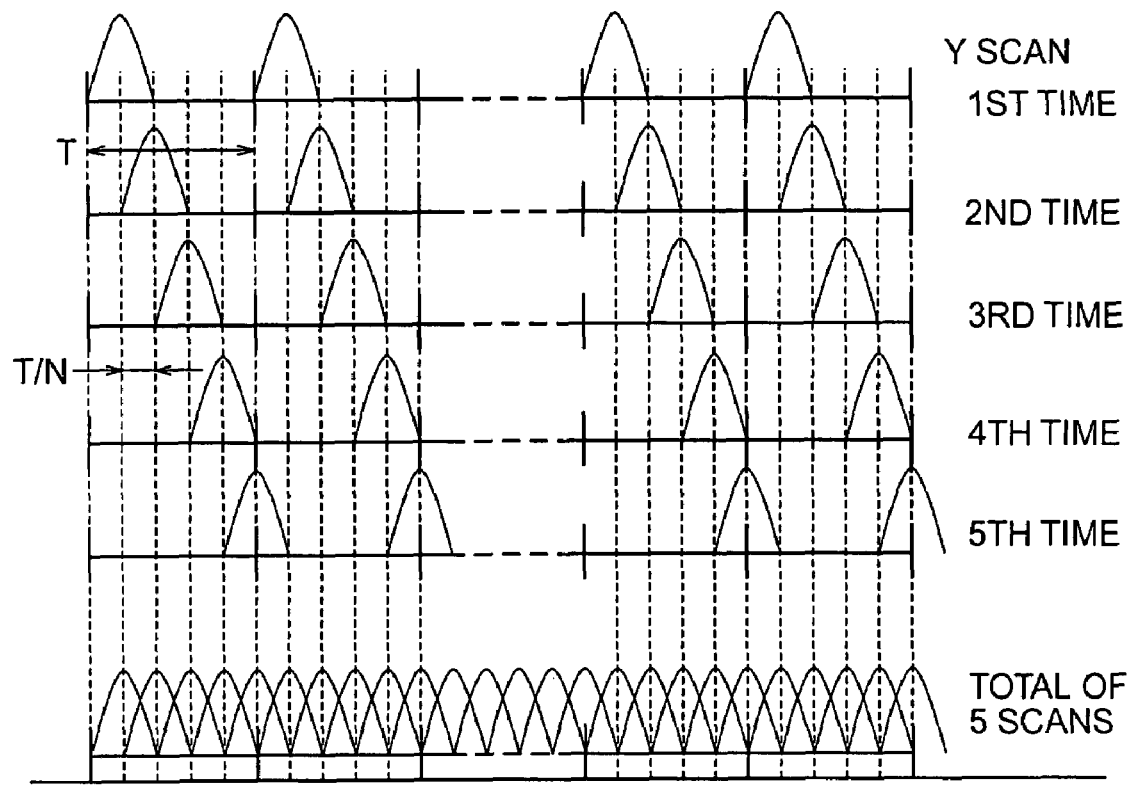
FIG. 4 is a diagram for explaining beam overlap irradiation onto a wafer, which is realized by a Y-scan control according to this invention.

Referring to FIG. 4, a description will be given of the control operation by the controller 22, i.e. the operation for the control such that, based on the number of rotation of the rotary disk 100 per unit time, the Y-scan speed, the number of Y-scan times, the reversal start timing of the rotary disk 100, and the measured value of the beam width or the predetermined value of the beam width, the beam is always overlap-irradiated onto each wafer 110 regardless of the beam size.

Figure 2:
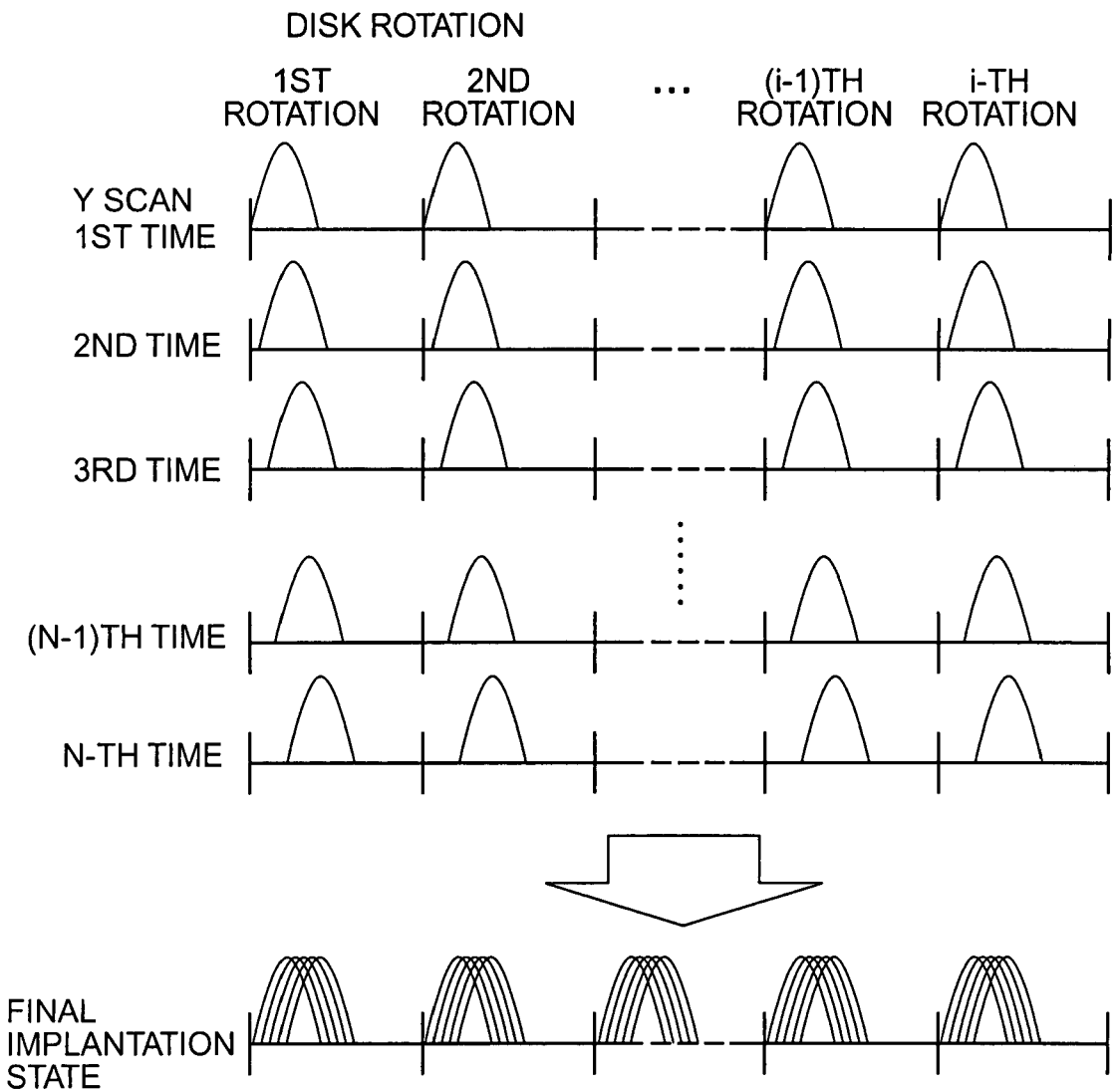
FIG. 2 is a diagram for explaining nonuniformity of ion implantation that occurs due to a Y-scan operation with the rotary disk shown in FIG. 1.

FIG. 4 shows, like FIG. 2, a transition of beam irradiation with respect to one wafer, wherein a rotation period (time required for each rotation) of the rotary disk 100 is T and the number of Y-scan times N is 5. One reciprocating movement between the outer overscan position and the inner overscan position is given as one Y scan. As shown at the final stage in FIG. 4 as "Total of 5 Scans", when the rotating wafer 110 is observed at the same passing point, beam irradiation forms beam irradiation regions that uniformly overlap each other over the entire diameter region of the wafer 110. Further, each overlap region is set to be half the beam irradiation region. It is preferable that each overlap region be set to half or more the beam irradiation region. For achieving it, the controller 22 performs a Y-scan control in the following manner according to a predetermined control program stored in an internal storage device 22-1. The internal storage device 22-1 may be replaced by an outer storage device.

1. The reversal start timing at a scan start reference position (overscan position) is delayed for every Y scan based on a disk sync signal by a time (T/N) derived by dividing the rotation period T of the rotary disk 100 by the number of Y-scan times N, thereby forcibly shifting the reversal start timing. This serves to prevent the phenomenon of accidental synchronization. Herein, the disk sync signal is a detection signal indicative of the initial position detection target portion 101 (FIG. 1) obtained from the target portion sensor 15. In this exemplary embodiment, this detection signal is used for determining the reversal start timing of the Y scan.

2. If the number of Y-scan times N becomes too large, the delay time (T/N) becomes too small, thus making actual control difficult. Therefore, the following is preferable.

A certain number of Y-scan times N' is determined and the rotation period T is divided by Nx equal to N' or more and less than 2N'. That is, when the number of Y-scan times N is large, Nx increases by stages as the number of Y-scan times approaches N. In actual control software, N' is set to 4 so that the scan pitch at 200 rpm of the rotary disk 100 virtually becomes equivalent to that at 815 rpm. Accordingly, when the number of Y-scan times N=4 to 7, the delay time is set to T/N as it is. On the other hand, when the number of Y-scan times N=8, two sets of delay times T/4 are derived and, when the number of Y-scan times N=9 to 11, one set of a delay time T/4 and one set of a delay time T/(N−4) are derived. N' is set to 4 herein because 200 rpm of the rotary disk 100 is set to a target and, therefore, there is no absolute meaning.

3. There are the following two methods for controlling the Y-scan reversal start timing.

3-1. The reversal start timing is controlled only at the inner overscan position or only at the outer overscan position.

3-2. The reversal start timing is controlled at both the inner overscan position and the outer overscan position. Naturally, the method of controlling the reversal start timing at both positions achieves a higher effect for improving the ion implantation unevenness.

4. It is not necessary to reduce the Y-scan speed in the above control. However, in actual control, the Y-scan speed is changed depending on a change in beam current and is further changed by a (1/R) scan and, therefore, it is of course preferable to perform the control also taking into account a change in Y-scan speed.

Now, the operation of this embodiment will be described.

1) The Y-scan speed and the number of Y-scan times N are determined depending on the required total beam irradiation amount for the wafers 110.

2) The delay time $T_{delay}$=T/N is determined from the rotation period T of the rotary disk 100 and the number of Y-scan times N.

3) The inner overscan position and the outer overscan position are determined by measuring a beam profile. Specifically, the inner overscan position and the outer overscan position are set by measuring a beam width and one end position and the other end position in a scan direction on a beam cross section.

4) The timing of reversal of the rotary disk 100 is derived based on a disk sync signal at at least the inner overscan position selected from the inner overscan position and the outer overscan position.

5) The first scan is started with no delay. From the second scan and thereafter, the start timing (reversal start timing) from the overscan position is regularly delayed per delay time $T_{delay}$. As a result, the third scan is delayed by $2T_{delay}$ from the start time point and the fourth scan is delayed by $3T_{delay}$ from the start time point. It is preferable that the N-th scan returns to the disk sync position at the start time point.

Figure 6A:
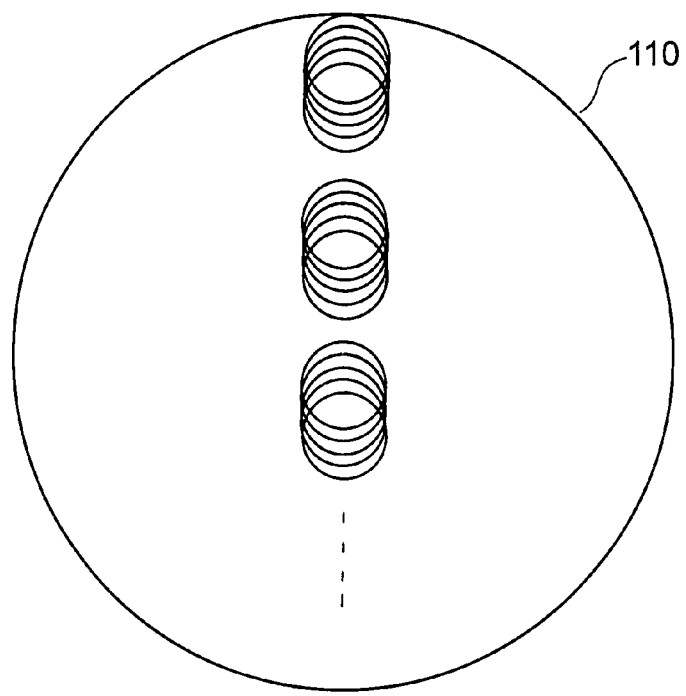
FIG. 6A is a diagram for explaining overlap of a beam irradiated onto a wafer by the Y-scan operation shown in FIG. 2
Figure 6B:
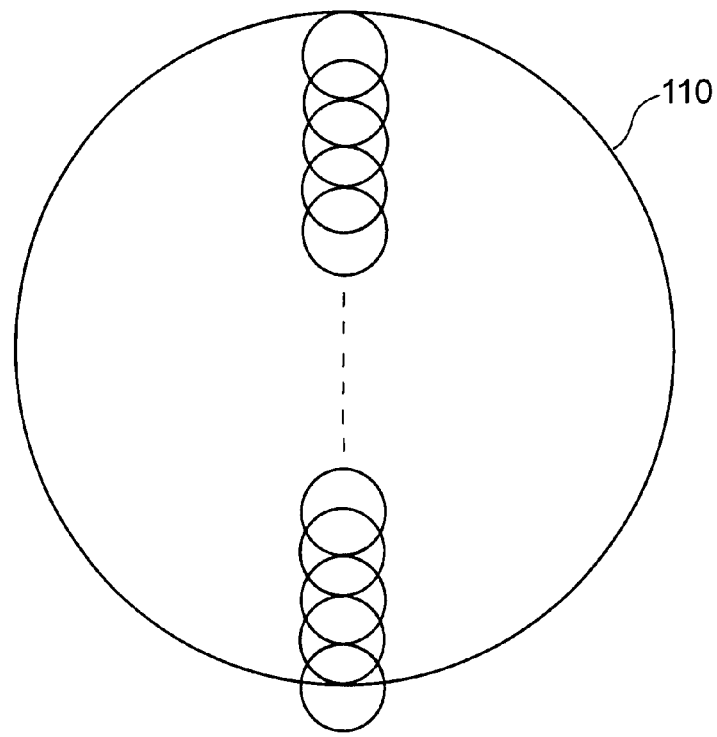
FIG. 6B is a diagram for explaining overlap of a beam irradiated onto a wafer by a Y-scan operation according to this invention shown in FIG. 4.

If an irradiation state (state of the rotating wafer 110 observed at the same passing point) shown as "Total of 5 Scans" at the final stage in FIG. 4 is expressed in a plan view, FIG. 6B is obtained, wherein the beam is always overlap-irradiated onto the wafer 110.

6) As a result, the risk of accidental synchronization is reduced and thus the ion implantation uniformity is improved.

It is preferable that the relationship between the required total beam irradiation amount and the Y-scan speed/the number of Y-scan times N be prepared as a table in advance and be stored in the internal storage device 22-1.

Figure 5:
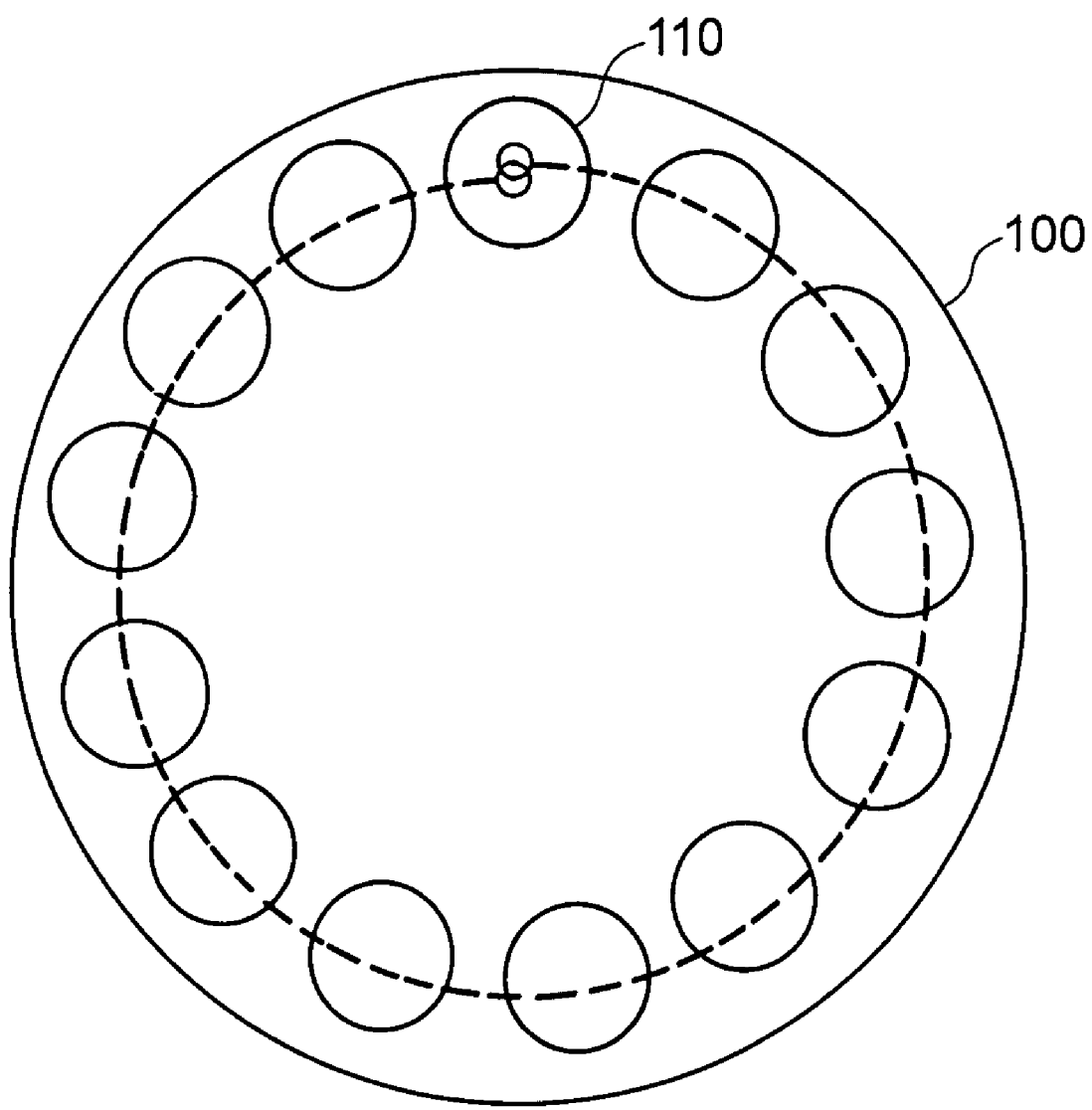
FIG. 5 is a diagram showing a beam irradiation trajectory with respect to a plurality of wafers during one rotation of the rotary disk according to this invention.

FIG. 5 shows a beam irradiation trajectory with respect to the respective wafers 110 during one rotation of the rotary disk 100.

As described above, in this exemplary embodiment, even when the number of rotation of the rotary disk is as low as about 150 to 300 rpm, by always ensuring overlap of beam irradiation per rotation of the rotary disk, it is possible to maintain the ion implantation uniformity to an extent that does not exceed 1% without largely reducing the Y-scan speed.

The description given above is for the exemplary embodiment of this invention. The controller 22 may implement control operation in the following manner.

The control is performed to ensure overlap regions each overlapping at least half of a last beam irradiation region on each wafer 110, by regularly delaying per scan the reversal start timing of the rotary disk 100 at at least one of the inner overscan position and the outer overscan position. Herein, "regularly" represents a shift by a pitch Pz equal to half the beam size per scan, so that Pz×N≧stroke pitch (Y-scan stroke distance). Of course, the reversal start timing is determined based on a disk sync signal.

The reversal start timing of the rotary disk 100 is randomly controlled based on random numbers.

The reversal start timing of the rotary disk 100 is controlled based on a programmed function Z=f (r, n, v, w) representing the relationship among the number of rotation r of the rotary disk 100 per unit time, the number of Y-scan times n, the Y-scan speed v, and the measured value w of the beam width.

The relationship among the number of rotation of the rotary disk 100 per unit time, the number of Y-scan times, the Y-scan speed, and the measured value of the beam width is stored as table data in the internal storage device in advance and the reversal start timing of the rotary disk 100 is controlled based on the stored table data. Although the relationship among them changes depending on the ion implantation conditions, the following is one example thereof.

Ion Implantation Condition : Total Necessary Dose Amount A ion/cm$^{-2}$ [Ion Species: Phosphorus (P), Beam Energy: 50 keV, Beam Current Value: 10 mA]

Number of Rotation of Rotary Disk: 150 to 800 rpm

Number of Y-Scan Times: 1 to 100 Reciprocation Times

Y-Scan Speed: 0.1 to 10 cm/sec

Measured Value of Beam Width: 1 to 100 mm

When the number of rotation of the rotary disk 100 is 400 rpm or less, a nonuniformity risk reduction judgment index based on the following formula is used as a standard. That is, the nonuniformity risk reduction judgment index and uniformity measurement values are used to derive a standard for "target uniformity %".

$$\text{Uniformity Risk} = \text{Magnitude of Nonuniformity}$$
$$\text{upon Occurrence} \times \text{Probability of Occurrence} =$$
$$(\text{Beam Size/Scan Pitch}) \times \sqrt{\text{Number of } Y - \text{Scan Times}}$$

As mentioned above, it is preferable that the controller in the beam processing system accordong to this invention has the following functions.

The controller sets the inner overscan position and the outer overscan position depending on the measured value of the beam width and measured values of one end position and the other end position in a scan direction on a cross section of the processing beam.

The controller determines the scan speed and the number of reciprocating scan times of the reciprocating scan motion depending on a required total beam irradiation amount.

The controller ensures the overlap region between the last and current processing beam irradiation regions on each of the plurality of processing objects by regularly delaying per scan the reversal start timing of the disk at the at least one of the inner overscan position and the outer overscan position.

In case where the beam processing system further comprises a target detecting unit provided at a position adjacent to the disk for detecting an initial position detection target portion provided at a predetermined position of the disk while the disk is rotating, and the target detecting unit outputting a detection signal, the controller delays the reversal start timing based on the detection signal.

The controller ensures the overlap region between the last and current processing beam irradiation regions on each of the plurality of processing objects by delaying per scan the reversal start timing of the disk at the at least one of the inner overscan position and the outer overscan position by a delay time (T/Nx) derived by dividing a rotation period T of the disk by a value Nx set based on the number of reciprocating scan times N.

When the number of reciprocating scan times N is large, the controller sets the value Nx so as to increase by stages as the number of reciprocating times approaches the number N.

The controller ensures the overlap region between the last and current processing beam irradiation regions on each of the plurality of processing objects by randomly controlling, based on random numbers, the reversal start timing of the disk at the at least one of the inner overscan position and the outer overscan position.

The controller ensures the overlap region between the last and current processing beam irradiation regions on each of the plurality of processing objects by controlling the reversal start timing of the disk at the at least one of the inner overscan position and the outer overscan position, based on a programmed relationship of the number of rotation of the disk, the number of reciprocating scan times, the scan speed, and the measured value of the beam width.

The controller stores a relationship between the number of rotation of the disk and the number of reciprocating scan times as table data in a storage device in advance and ensures the overlap region between the last and current processing beam irradiation regions on each of the plurality of processing objects by controlling, based on the table data, the reversal start timing of the disk at the at least one of the inner overscan position and the outer overscan position.

In the beam processing method according to this invention, it may comprises setting the inner overscan position and the outer overscan position depending on the measured value of the beam width and measured values of one end position and the other end position in a scan direction on a cross section of the processing beam.

In the beam processing method according to this invention, it may comprises determining the scan speed and the number of reciprocating scan times of the reciprocating scan motion depending on a required total beam irradiation amount.

In the beam processing method according to this invention, it may comprises ensuring the overlap region between the last and current processing beam irradiation regions on each of the plurality of processing objects by regularly delaying per scan the reversal start timing of the disk at the at least one of the inner overscan position and the outer overscan position.

In the beam processing method according to this invention, it may comprises using, as a reference for delaying the reversal start timing, a detection signal obtained by detecting an initial position detection target portion provided at a predetermined position of the disk while the disk is rotating.

In the beam processing method according to this invention, it may comprises ensuring the overlap region between the last and current processing beam irradiation regions on each of the plurality of processing objects by delaying per scan the reversal start timing of the disk at the at least one of the inner overscan position and the outer overscan position by a delay time (T/Nx) derived by dividing a rotation period T of the disk by a value Nx set based on the number of reciprocating scan times N.

In the beam processing method according to this invention, it may comprises using, as a reference for delaying the reversal start timing, a detection signal obtained by detecting an initial position detection target portion provided at a predetermined position of the disk while the disk is rotating.

In the beam processing method according to this invention, it may comprises, when the number of reciprocating scan times N is large, setting the value Nx so as to increase by stages as the number of reciprocating times approaches the number N.

In the beam processing method according to this invention, it may comprises ensuring the overlap region between the last and current processing beam irradiation regions on each of the plurality of processing objects by randomly controlling, based on random numbers, the reversal start timing of the disk at the at least one of the inner overscan position and the outer overscan position.

In the beam processing method according to this invention, it may comprises ensuring the overlap region between the last and current processing beam irradiation regions on each of the plurality of processing objects by controlling the reversal start timing of the disk at the at least one of the inner overscan position and the outer overscan position, based on a programmed relationship of the number of rotation of the disk, the number of reciprocating scan times, the scan speed, and the measured value of the beam width.

In the beam processing method according to this invention, it may comprises preparing a relationship between the number of rotation of the disk and the number of reciprocating scan times as table data in advance and ensuring the overlap region between the last and current processing beam irradiation regions on each of the plurality of processing objects by controlling, based on the table data, the reversal start timing of the disk at the at least one of the inner overscan position and the outer overscan position.

Furthermore, this invention may be carried out in the following aspects.

(First Aspect)

A beam processing system, wherein a controller sets a Y-scan speed based on selection and setting of the number of rotation of a rotary disk per unit time so that a distance of a Y-scan moving during one rotation of the rotary disk becomes smaller than a measured value of a beam width or a predetermined value of a beam width and, after determining the number of Y-scan times, sets a reversal start timing of the Y scan, thereby controlling a low-speed scan drive mechanism so that beam irradiation is performed onto wafers so as to always provide an overlap region overlapping at least half of a previous beam irradiation region on each wafer in every beam irradiation.

(Second Aspect)

A beam processing method of setting a Y-scan speed based on selection and setting of the number of rotation of a rotary disk per unit time so that a distance of a Y-scan moving during one rotation of the rotary disk becomes smaller than a measured value of a beam width or a predetermined value of a beam width and, after determining the number of Y-scan times, setting a reversal start timing of the Y scan, thereby controlling the Y scan so that beam irradiation is performed onto wafers so as to always provide an overlap region overlapping at least half of a previous beam irradiation region on each wafer in every beam irradiation.

(Third Aspect)

A beam processing system, wherein a controller sets a Y-scan speed based on selection and setting of the number of rotation of a rotary disk per unit time so that a distance of a Y-scan moving during one rotation of the rotary disk becomes greater than a measured value of a beam width or a predetermined value of a beam width and, after selecting the number of Y-scan times, sets a reversal start timing of the Y scan, thereby controlling a low-speed scan drive mechanism so that beam irradiation is performed onto wafers so as to always provide an overlap region overlapping at least half of a previous beam irradiation region on each wafer.

(Fourth Aspect)

A beam processing method of setting a Y-scan speed based on selection and setting of the number of rotation of a rotary disk per unit time so that a distance of a Y-scan moving during one rotation of the rotary disk becomes greater than a measured value of a beam width or a predetermined value of a beam width and, after selecting the number of Y-scan times, setting a reversal start timing of the Y scan, thereby controlling the Y scan so that beam irradiation is performed onto wafers so as to always provide an overlap region overlapping at least half of a previous beam irradiation region on each wafer.

While the present invention has thus far been described in connection with the exemplary embodiments thereof, it will readily be possible for those skilled in the art to put this invention into practice in various other manners.

What is claimed is:

1. A beam processing system comprising a disk mounted thereon with a plurality of processing objects on the same circumference, a rotation drive mechanism for rotating said disk about a disk axis, a reciprocating drive mechanism for causing said disk, while rotating, to perform a reciprocating scan motion in a direction perpendicular to said disk axis within a stroke range defined by an inner overscan position and an outer overscan position, and a controller for controlling at least said reciprocating drive mechanism, said beam processing system causing said plurality of processing objects to pass through an irradiation position of a processing beam by rotation and the reciprocating scan motion of said disk, thereby irradiating the processing beam onto said plurality of processing objects, wherein said beam processing system further comprises a beam width measuring unit for measuring a beam width of said processing beam, said controller sets said inner overscan position and said outer overscan position depending on a measured value of said beam width or a predetermined value of said beam width, and said controller, based on the number of rotation of said disk per unit time, a scan speed and the number of reciprocating scan times of said reciprocating scan motion, a reversal start timing of said disk at at least one of said inner overscan position and said outer overscan position, and said measured value of the beam width or said predetermined value of the beam width, controls said reciprocating drive mechanism so as to ensure an overlap region between a last and a current processing beam irradiation region on each of said plurality of processing objects, said overlap region overlapping at least half of said last processing beam irradiation region.

2. The beam processing system according to claim 1, wherein said controller sets said inner overscan position and said outer overscan position depending on said measured value of the beam width and measured values of one end position and the other end position in a scan direction on a cross section of the processing beam.

3. The beam processing system according to claim 1, wherein said controller determines the scan speed and the number of reciprocating scan times of said reciprocating scan motion depending on a required total beam irradiation amount.

4. The beam processing system according to claim 1, wherein said controller ensures said overlap region between the last and current processing beam irradiation regions on each of said plurality of processing objects by regularly delaying per scan the reversal start timing of said disk at said at least one of said inner overscan position and said outer overscan position.

5. The beam processing system according to claim 4, further comprising a target detecting unit provided at a position adjacent to said disk for detecting an initial position detection target portion provided at a predetermined position of said disk while said disk is rotating, and outputting a detection signal, wherein said controller delays said reversal start timing based on said detection signal.

6. The beam processing system according to claim 1, wherein said controller ensures said overlap region between the last and current processing beam irradiation regions on each of said plurality of processing objects by delaying per scan the reversal start timing of said disk at said at least one of said inner overscan position and said outer overscan position by a delay time (T/Nx) derived by dividing a rotation period T of said disk by a value Nx set based on the number of reciprocating scan times N.

7. The beam processing system according to claim 6, further comprising a target detecting unit provided at a position adjacent to said disk for detecting an initial position detection target portion provided at a predetermined position of said disk while said disk is rotating, and outputting a detection signal, wherein said controller delays said reversal start timing based on said detection signal.

8. The beam processing system according to claim 6, wherein when said number of reciprocating scan times N is large, said controller sets said value Nx so as to increase by stages as the number of reciprocating times approaches the number N.

9. The beam processing system according to claim 1, wherein said controller ensures said overlap region between the last and current processing beam irradiation regions on each of said plurality of processing objects by randomly controlling, based on random numbers, the reversal start timing of said disk at said at least one of said inner overscan position and said outer overscan position.

10. The beam processing system according to claim 1, wherein said controller ensures said overlap region between the last and current processing beam irradiation regions on each of said plurality of processing objects by controlling the reversal start timing of said disk at said at least one of said inner overscan position and said outer overscan position, based on a programmed relationship of said number of rotation of said disk, said number of reciprocating scan times, said scan speed, and said measured value of the beam width.

11. The beam processing system according to claim 1, wherein said controller stores a relationship between said number of rotation of said disk and said number of reciprocating scan times as table data in a storage device in advance and ensures said overlap region between the last and current processing beam irradiation regions on each of said plurality of processing objects by controlling, based on said table data, the reversal start timing of said disk at said at least one of said inner overscan position and said outer overscan position.

12. A beam processing method that causes a disk mounted thereon with a plurality of processing objects on the same circumference to rotate about a disk axis, causes said disk, while rotating, to perform a reciprocating scan motion in a direction perpendicular to said disk axis within a stroke range defined by an inner overscan position and an outer overscan position, and causes said plurality of processing objects to pass through an irradiation position of a processing beam by rotation and the reciprocating scan motion of said disk, thereby irradiating the processing beam onto said plurality of processing objects, said beam processing method comprising:
  measuring a beam width of said processing beam;
  setting said inner overscan position and said outer overscan position depending on a measured value of said beam width or a predetermined value of said beam width; and
  based on the number of rotation of said disk per unit time, a scan speed and the number of reciprocating scan times of said reciprocating scan motion, a reversal start timing of said disk at at least one of said inner overscan position and said outer overscan position, and said measured value of the beam width or said predetermined value of the beam width, controlling said reciprocating scan motion so as to ensure an overlap region between a last and a current processing beam irradiation region on each of said plurality of processing objects, said overlap region overlapping at least half of said last processing beam irradiation region.

13. The beam processing method according to claim 12, comprising setting said inner overscan position and said outer overscan position depending on said measured value of the beam width and measured values of one end position and the other end position in a scan direction on a cross section of the processing beam.

14. The beam processing method according to claim 12, comprising determining the scan speed and the number of reciprocating scan times of said reciprocating scan motion depending on a required total beam irradiation amount.

15. The beam processing method according to claim 12, comprising ensuring said overlap region between the last and current processing beam irradiation regions on each of said plurality of processing objects by regularly delaying per scan the reversal start timing of said disk at said at least one of said inner overscan position and said outer overscan position.

16. The beam processing method according to claim 15, comprising using, as a reference for delaying said reversal start timing, a detection signal obtained by detecting an initial position detection target portion provided at a predetermined position of said disk while said disk is rotating.

17. The beam processing method according to claim 12, comprising ensuring said overlap region between the last and current processing beam irradiation regions on each of said plurality of processing objects by delaying per scan the reversal start timing of said disk at said at least one of said inner overscan position and said outer overscan position by a delay time (T/Nx) derived by dividing a rotation period T of said disk by a value Nx set based on the number of reciprocating scan times N.

18. The beam processing method according to claim 17, comprising using, as a reference for delaying said reversal start timing, a detection signal obtained by detecting an initial position detection target portion provided at a predetermined position of said disk while said disk is rotating.

19. The beam processing method according to claim 17, comprising, when said number of reciprocating scan times N is large, setting said value Nx so as to increase by stages as the number of reciprocating times approaches the number N.

20. The beam processing method according to claim 12, comprising ensuring said overlap region between the last and current processing beam irradiation regions on each of said plurality of processing objects by randomly controlling, based on random numbers, the reversal start timing of said disk at said at least one of said inner overscan position and said outer overscan position.

21. The beam processing method according to claim 12, comprising ensuring said overlap region between the last and current processing beam irradiation regions on each of said plurality of processing objects by controlling the reversal start timing of said disk at said at least one of said inner overscan position and said outer overscan position, based on a programmed relationship of said number of rotation of said disk, said number of reciprocating scan times, said scan speed, and said measured value of the beam width.

22. The beam processing method according to claim 12, comprising preparing a relationship between said number of rotation of said disk and said number of reciprocating scan times as table data in advance and ensuring said overlap region between the last and current processing beam irradiation regions on each of said plurality of processing objects by controlling, based on said table data, the reversal start timing of said disk at said at least one of said inner overscan position and said outer overscan position.

23. A beam processing system comprising a disk mounted thereon with a plurality of processing objects on the same circumference, a rotation drive mechanism for rotating said disk about a disk axis, a reciprocating drive mechanism for causing said disk, while rotating, to perform a reciprocating scan motion in a direction perpendicular to said disk axis within a stroke range defined by an inner overscan position and an outer overscan position, and a controller for controlling at least said reciprocating drive mechanism, said beam processing system causing said plurality of processing objects to pass through an irradiation position of a processing beam by rotation and the reciprocating scan motion of said disk, thereby irradiating the processing beam onto said plurality of processing objects,
  wherein said beam processing system further comprises a beam width measuring unit for measuring a beam width of said processing beam, said controller sets said inner overscan position and said outer overscan position depending on a measured value of said beam width or a predetermined value of said beam width, and said controller sets a scan speed of said reciprocating scan motion based on selection and setting of the number of rotation of said disk per unit time so that a distance of said reciprocating scan motion during one rotation of said disk becomes smaller than said measured value of the beam width or said predetermined value of the beam width and, after determining the number of reciprocating scan times, sets a reversal start timing of said reciprocating scan motion, thereby controlling said reciprocating drive mechanism so that irradiation of the processing beam is performed onto said plurality of processing objects so as to provide an overlap region overlapping at least half of a last irradiation region of the processing beam on each of said plurality of processing objects.

24. A beam processing method that causes a disk mounted thereon with a plurality of processing objects on the same circumference to rotate about a disk axis, causes said disk, while rotating, to perform a reciprocating scan motion in a direction perpendicular to said disk axis within a stroke range defined by an inner overscan position and an outer overscan position, and causes said plurality of processing objects to pass through an irradiation position of a processing beam by rotation and the reciprocating scan motion of said disk, thereby irradiating the processing beam onto said plurality of processing objects, said beam processing method comprising:

measuring a beam width of said processing beam;

setting said inner overscan position and said outer overscan position depending on a measured value of said beam width or a predetermined value of said beam width; and setting a scan speed of said reciprocating scan motion based on selection and setting of the number of rotation of said disk per unit time so that a distance of said reciprocating scan motion during one rotation of said disk becomes smaller than said measured value of the beam width or said predetermined value of the beam width and, after determining the number of reciprocating scan times, setting a reversal start timing of said reciprocating scan motion, thereby controlling said reciprocating scan motion so that irradiation of the processing beam is performed onto said plurality of processing objects so as to provide an overlap region overlapping at least half of a last irradiation region of the processing beam on each of said plurality of processing objects.

25. A beam processing system comprising a disk mounted thereon with a plurality of processing objects on the same circumference, a rotation drive mechanism for rotating said disk about a disk axis, a reciprocating drive mechanism for causing said disk, while rotating, to perform a reciprocating scan motion in a direction perpendicular to said disk axis within a stroke range defined by an inner overscan position and an outer overscan position, and a controller for controlling at least said reciprocating drive mechanism, said beam processing system causing said plurality of processing objects to pass through an irradiation position of a processing beam by rotation and the reciprocating scan motion of said disk, thereby irradiating the processing beam onto said plurality of processing objects, wherein said beam processing system further comprises a beam width measuring unit for measuring a beam width of said processing beam, said controller sets said inner overscan position and said outer overscan position depending on a measured value of said beam width or a predetermined value of said beam width, and said controller sets a scan speed of said reciprocating scan motion based on selection and setting of the number of rotation of said disk per unit time so that a distance of said reciprocating scan motion during one rotation of said disk becomes greater than said measured value of the beam width or said predetermined value of the beam width and, after selecting the number of reciprocating scan times, sets a reversal start timing of said reciprocating scan motion, thereby controlling said reciprocating drive mechanism so that irradiation of the processing beam is performed onto said plurality of processing objects so as to provide an overlap region overlapping at least half of a last irradiation region of the processing beam on each of said plurality of processing objects.

26. A beam processing method that causes a disk mounted thereon with a plurality of processing objects on the same circumference to rotate about a disk axis, causes said disk, while rotating, to perform a reciprocating scan motion in a direction perpendicular to said disk axis within a stroke range defined by an inner overscan position and an outer overscan position, and causes said plurality of processing objects to pass through an irradiation position of a processing beam by rotation and the reciprocating scan motion of said disk, thereby irradiating the processing beam onto said plurality of processing objects, said beam processing method comprising:

measuring a beam width of said processing beam;

setting said inner overscan position and said outer overscan position depending on a measured value of said beam width or a predetermined value of said beam width; and setting a scan speed of said reciprocating scan motion based on selection and setting of the number of rotation of said disk per unit time so that a distance of said reciprocating scan motion during one rotation of said disk becomes greater than said measured value of the beam width or said predetermined value of the beam width and, after selecting the number of reciprocating scan times, setting a reversal start timing of said reciprocating scan motion, thereby controlling said reciprocating scan motion so that irradiation of the processing beam is performed onto said plurality of processing objects so as to provide an overlap region overlapping at least half of a last irradiation region of the processing beam on each of said plurality of processing objects.

* * * * *

UNITED STATES PATENT AND TRADEMARK OFFICE
CERTIFICATE OF CORRECTION

PATENT NO.         : 7,411,709 B2                                          Page 1 of 1
APPLICATION NO.    : 11/806546
DATED              : August 12, 2008
INVENTOR(S)        : Takanori Yagita et al.

It is certified that error appears in the above-identified patent and that said Letters Patent is hereby corrected as shown below:

Title Page-

In Item (73) Assignee, please correct to read as follows:

Item --(73) Assignee: --SEN Corporation, an SHI and Axcelis Company--.

Signed and Sealed this

Tenth Day of March, 2009

JOHN DOLL
*Acting Director of the United States Patent and Trademark Office*